(12) United States Patent
Peschke

(10) Patent No.: US 10,048,292 B1
(45) Date of Patent: Aug. 14, 2018

(54) LOGIC SIGNAL ANALYZER, LOGIC PROBE AS WELL AS OSCILLOSCOPE

(71) Applicant: Rohde & Schwarz GmbH & Co. KG, Munich (DE)

(72) Inventor: Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/582,173

(22) Filed: Apr. 28, 2017

(51) Int. Cl.
*G01R 13/02* (2006.01)

(52) U.S. Cl.
CPC ....... *G01R 13/0218* (2013.01); *G01R 13/029* (2013.01)

(58) Field of Classification Search
CPC ... G01R 13/34; G01R 13/029; G01R 13/0218
See application file for complete search history.

(56) References Cited

U.S. PATENT DOCUMENTS

| | | | |
|---|---|---|---|
| 6,931,331 B2 | 8/2005 | McTigue | |
| 2008/0030217 A1* | 2/2008 | Patel | G01R 31/31924 324/759.01 |
| 2008/0036539 A1* | 2/2008 | Kodera | G01R 31/31924 330/264 |
| 2010/0085034 A1* | 4/2010 | Sakayori | G01R 19/0092 324/76.11 |

\* cited by examiner

*Primary Examiner* — Jermele M Hollington
*Assistant Examiner* — Alvaro Fortich
(74) *Attorney, Agent, or Firm* — Christensen O'Connor Johnson Kindness PLLC

(57) ABSTRACT

A logic signal analyzer for analyzing logic signals has a positive measurement input providing a positive measurement input voltage value, a negative measurement input providing a negative measurement input voltage value, a third input providing a third input voltage value, and a comparison unit. The comparison unit being configured to provide a first and a second comparison output voltage value each based on one of at least four comparison modes. The first and second comparison output values are based on different comparison modes.

19 Claims, 4 Drawing Sheets

LOGIC SIGNAL ANALYZER, LOGIC PROBE AS WELL AS OSCILLOSCOPE

FIELD OF THE DISCLOSURE

Embodiments of the present disclosure relate generally to a logic signal analyzer for analyzing logic signals, a logic probe as well as an oscilloscope.

BACKGROUND

When measuring differential logic signals, it is often required to measure each of the two signals of the differential logic signal (p-side, n-side) or the clock separately in order to detect errors, for example a delay between the two signals.

In the state of the art, logic signal analyzers are known that measure the two signals of a differential logic signal separately and perform a certain operation on the measured signals. In order to change the mode of processing, the way of contacting the device under test or the wiring has to be changed.

Thus, there is a need for a versatile and simple possibility to use logic signal analyzer, a logic probe as well as an oscilloscope.

SUMMARY

Embodiments of the present disclosure provide a logic signal analyzer for analyzing logic signals comprising a positive measurement input providing a positive measurement input voltage value, a negative measurement input providing a negative measurement input voltage value, a third input providing a third input voltage value, and a comparison unit. In some embodiments, the comparison unit is configured to provide a first and a second comparison output voltage value each based on one of the following comparison modes:
  (1) wherein the positive measurement input voltage value is compared with the negative measurement input voltage value;
  (2) wherein the positive measurement input voltage value is compared with the third input voltage value;
  (3) wherein the negative measurement input voltage value is compared with the third input voltage value; and
  (4) wherein an average of the positive measurement input voltage value and the negative measurement input voltage value is compared with the third input voltage value, The first and second comparison output values in the aforementioned embodiments are based on different comparison modes.

In some embodiments, the first and second comparison output values may be outputted simultaneously via multiple outputs of the logic signal analyzer or one at a time via a single output of the logic signal analyzer. The different comparison modes are defined by the signals that are compared with each other. The logic signal analyzer enables the possibility to measure the single signals of a differential logic signal separately, for example, by comparing the positive measurement input voltage value or the negative input voltage value with the third input voltage value, for example ground. In addition, the common mode can be measured separately in a specific comparison mode. Thus, it is possible to determine a delay between the signals. Accordingly, the different comparison modes relate to p-side (positive measurement input voltage value), n-side (negative measurement input voltage value), differential, and common mode.

In some embodiments, the two signals lines for the differential logic signal may be connected to the positive measurement input and the negative measurement input.

Switching between the values to be compared and/or choosing the comparison mode for the output values can be done without changing the wiring, modifying the way the device under test is contacted, or adapting the measurement setup. Thus, a versatile and easy-to-use logic signal analyzer is provided. In some embodiments, the logic signal analyzer has a multimode function.

According to an aspect, the third input voltage value is either zero or at least a predetermined threshold voltage value. Thus, the threshold voltage of the signal to be measured can be set individually. A single signal of the differential logic signal, for example, the signal relating to the positive measurement input voltage value or the negative input voltage value, may be measured solely while being compared with zero or a predefined threshold.

In an example, the third input is connected to ground or a threshold voltage source for providing a predetermined threshold voltage as the threshold voltage value, enabling the user to set the threshold voltage value independently from the device under test. Ground can correspond to a voltage value being zero.

According to another aspect, the logic signal analyzer comprises at least an average signal line connected to the positive measurement input via a first resistor and the negative measurement input via a second resistor. In this way, a signal corresponding to the average between the two signals of the differential logic signal can be created.

In order to provide an average signal reliably, the logic signal analyzer in some embodiments comprises a voltage divider having the first resistor and the second resistor.

In another embodiment, the comparison unit comprises at least one comparison component with a first input and a second input receiving at least two of the input values. Thus, the comparison is performed by a comparison component.

In other embodiments, the comparison unit may comprise a first switching unit connecting the first input of the comparison component with one of the positive measurement input, the negative measurement input, and the average signal line, the comparison unit comprising a second switching unit connecting the second input of the comparison component with the third input or one of the positive measurement input and the negative measurement input. The switching units allow to efficiently select the input of the first input and the second input out of four different values.

The first switching unit and the second switching unit in some embodiments may be configured to change the comparison mode allowing for a change of comparison modes without the need to change the wiring of the device under test. Thus, the different comparison modes can be set by using the switching units. In a cost-efficient realization of the comparison unit, the comparison unit is a comparator.

According to another aspect, the comparison component comprises a differential amplifier and a comparator, the first input and the second input of the comparison component being connected to inputs of the differential amplifier, and the comparator receiving an output of the differential amplifier and a ground signal as input providing a more reliable way of comparing the first input against the second input.

In a variation, the comparison unit comprises four comparison components each providing an output voltage value; the first input and the second input of the first comparison component being connected to the positive measurement input and the negative measurement input, respectively, or vice versa; the first input and the second input of the second comparison component being connected to the positive measurement input and the third input, respectively, or vice versa; the first input and the second input of the third comparison component being connected to the negative measurement input and the third input, respectively, or vice versa; and the first input and the second input of the fourth comparison component being connected to the average signal line and the third input, respectively, or vice versa. In this way, four different output voltage values based on different comparison modes can be determined simultaneously.

In some embodiments, the comparison output voltage value may be selected from the output voltage values of the four comparison components by means of a switching unit realizing a simple and cost-efficient way to switch between different comparison modes. The comparison output voltage value relates to the one of the whole logic signal analyzer.

In addition or alternatively, four comparison output voltage values may be provided corresponding to the output voltage values of the four comparison components to provide as much information as possible at the same time. All comparison output voltage values are displayed simultaneously on a display of the logical signal analyzer, for instance.

The switching unit in some embodiment may be configured to change the comparison mode for simple switching between the comparison modes.

In another embodiment, the comparison unit comprises a comparator with two inputs, a switching unit and four differential amplifiers each having two inputs and an output; the positive measurement input and the negative measurement input being connected to the inputs of the first differential amplifier; the positive measurement input and the third input being connected to the inputs of the second differential amplifier; the negative measurement input and the third input being connected to the inputs of the third differential amplifier; the average signal line and the third input being connected to the inputs of the fourth differential amplifier; the switching unit connecting one of the outputs of the four differential amplifiers to one of the inputs of the comparator, the other input of the comparator being connected to ground. In this way, a comparison unit with only one switching unit and one comparator can be realized leading to a cost-efficient setup.

In some embodiments, the switching unit may be configured to change the mode of operation to allow switching the mode of operation without a need for changing the wiring of the logic signal analyzer and the device under test. Different comparison modes can be used without adapting the measurement setup.

In another aspect, an amplifier is provided between the comparison unit and at least one of the positive measurement input and the negative measurement input in order to amplify the measured signals. In some embodiments, several amplifiers are provided between the comparison unit and corresponding inputs.

According to another aspect of the present disclosure, embodiments of a logic probe comprising a logic signal analyzer as described above are provided.

According to another aspect of the present disclosure, embodiments of an oscilloscope comprising a logic signal analyzer as described above are provided.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
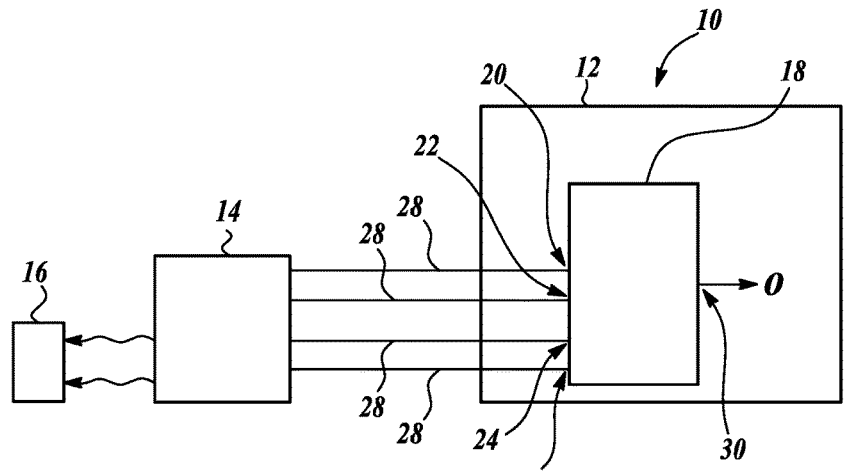
FIG. 1 shows schematically an oscilloscope according to an embodiment of the disclosure with a logic signal analyzer according to an embodiment of disclosure, and a logic probe.

FIG. 1 shows schematically a measurement system 10 comprising an oscilloscope 12 and a logic probe 14 connected to the oscilloscope 12. The logic probe 14 may be connected to a device under test 16 to measure a differential logic signal.

In the embodiment shown, the oscilloscope 12 comprises a logic signal analyzer 18 that receives the differential logic signal measured by the logic probe 14. The logic signal analyzer 18 has a positive measurement input 20, a negative measurement input 22, and a third input 24. In some embodiments, the logic signal analyzer 18 also may have a fourth input 26. The logic signal analyzer 18 further comprises an output 30.

In the embodiment shown in FIG. 1, each of the inputs 20, 22, 24, 26 is connected to the logic probe 14 with a separate signal line 28. The signal lines 28 may be separate cables or combined into a single cable or multiple multicore cables. In some embodiments, at least one input 20, 22, 24, 26 is connected to the logic probe 14 by a wireless data connection, including any combinations thereof.

Figure 2:
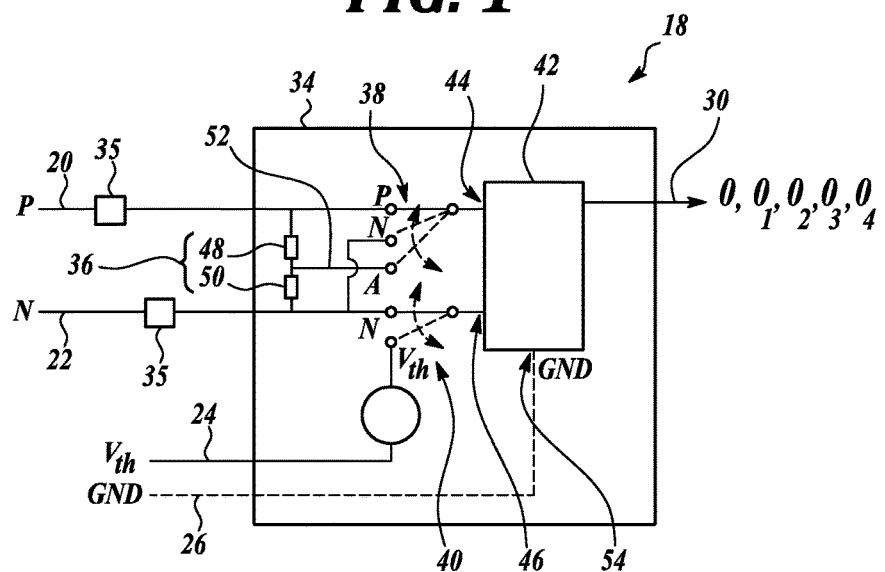
FIG. 2 shows schematically a logic signal analyzer according to an embodiment of the disclosure with a comparison component.

An embodiment of the logic signal analyzer 18 is shown in further detail in FIG. 2. As shown in FIG. 2, the logic signal analyzer 18 comprises a comparison unit 34 that receives the signals from the inputs 20, 22, 24, 26 and outputs a comparison output voltage O. In the embodiment shown, the output voltage O is outputted via the output 30 of the logic signal analyzer 18, which is the output of the comparison unit 34 as well.

In some embodiments, amplifiers 35 are provided between the positive measurement input 20 and the comparison unit 34 as well as between the negative measurement input 22 and the comparison unit 34.

Still referring to FIG. 2, the comparison unit 34 comprises a voltage divider 36, a first switching unit 38, a second switching unit 40, and a comparison component 42. The comparison component 42 has a first input 44 connected to the first switching unit 38 and a second input 46 connected to the second switching unit 40. The voltage divider 36 comprises a first resistor 48, a second resistor 50 and an average signal line 52. Both resistors 48, 50 are connected with the average signal line 52 with one of their ends, whereas the other end of the first resistor 48 is connected to the positive measurement input 20 and the other end of the second resistor 50 is connected to the negative measurement input 22.

In the embodiment shown in FIG. 2, the first switching unit 38 is configured to connect the positive measurement input 20, the negative measurement input 22 or the average signal line 52 with the first input 44 of the comparison component 42. On the other hand, the second switching unit 40 is configured to connect the negative measurement input 22 or the third input 24 with the second input 46 of the comparison component 42. Of course, other ways to wire the first switching unit 38 and the second switching unit 40 are possible. For example, the second switching unit 40 may connect the positive measurement input 22 or the third input 24 with the second input 46 of the comparison component 42. In some embodiments, the switching units 38, 40 may be transistors or the like.

The fourth input 26 may be directly fed to an additional input 54 of the comparison component 42.

Figure 3A:
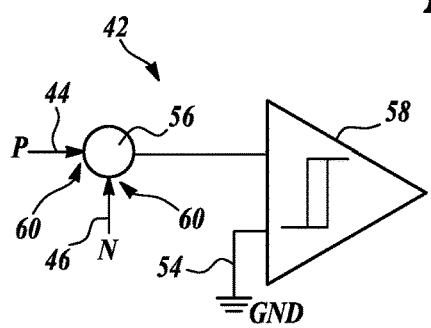
FIGS. 3a and 3b show schematically two different embodiments of a comparison component according to FIG. 2.

A first embodiment of the comparison component 42 is shown in FIG. 3a. As shown in FIG. 3a, the comparison component 42 comprises a differential amplifier 56 and a comparator 58. The two inputs 60 of the differential amplifier 56 are the first input 44 and the second input 46 of the comparison component 42.

The output of the differential amplifier 56 is connected to one of the inputs of the comparator 58. The other input of the comparator 58 is connected with the additional input 54, thus the fourth input 26 of the logic signal analyzer 18.

During a measurement using the measurement system 10, the logic probe 14 transmits a positive signal input at the positive measurement input 20 providing a positive measurement input voltage value P at the positive measurement input 20. Likewise, a negative signal is transferred to the negative measurement input 22 providing a negative measurement input voltage N. In addition, the logic probe 14 provides a threshold value $V_{th}$ to the third input 24 of the logic signal analyzer 18. The threshold voltage value $V_{th}$ can, for example, be set at the logic probe 14 with a knob or in another known manner.

The positive measurement input voltage P and the negative measurement input voltage N are also averaged by the voltage divider 36 to provide an average A of the positive measurement input voltage value P and the negative measurement input voltage value N. Thus, the positive measurement input voltage value P, the negative measurement input voltage value N or the average A can be provided to the first input 44 of the comparison component 42 by the first switching unit 38. Using the second switching unit 40, the threshold voltage value $V_{th}$ or the negative measurement input voltage value N can be provided to the second input 46 of the comparison component 42.

The logic probe 14 also provides a ground connection GND to the fourth input 26. In the logic signal analyzer 18, the ground is directly connected to the additional input 54 of the comparison component 42.

In the example shown in FIG. 3a, the voltage values P and N are fed to the first input 44 and the second input 46 of the comparison component 42, respectively. The positive measurement input voltage value P and the negative measurement input voltage value N are subtracted from each other by the differential amplifier 56 and the difference is then transmitted to the comparator 58.

In the comparator 58, the difference is compared to the ground GND. If the difference is greater than zero, then the positive measurement input voltage value P is greater than the negative measurement input voltage value N, and the comparator outputs a value indicating this fact. Otherwise, a different value as the comparison output voltage value is outputted by the comparator 58. This output voltage value is then applied to the output 30 as a first comparison output voltage value $O_1$ of the comparison unit 34 and the logic signal analyzer 18.

If the position of first and/or the second switching unit 38, 40 is changed, the first and/or the second switching unit 38, 40 provide a different voltage values to one or both of the inputs 44, 46. Then, the voltages compared by the comparison component 42 differ from the voltages compared before. Accordingly, a different comparison output voltage value, for example a second comparison output voltage value $O_2$ is determined.

In accordance with an aspect of the disclosure, the first switching unit 38 and the second switching unit 40 are controlled in a way to provide, for example, four different comparison modes, i.e. for different combinations of voltage values inputted at the first input 44 and second input 46 of the comparison component 42. Thus, the different comparison modes can be established without the need of adapting the measurement setup while setting the switching unit(s) 38, 40 appropriately.

These comparison modes are, for example: the positive measurement input voltage value P is provided at the first input 44 of the comparison component 42, and the negative measurement input voltage value N is provided at the second input 46 of the comparison component 42. This first comparison mode compares the positive measurement input voltage value P and the negative measurement input voltage value N yielding an output voltage value $O_1$.

In a second comparison mode, the positive measurement input voltage value P and the input voltage value of the third input 24, e.g. the threshold voltage value $V_{th}$ are provided at the first input 44 and the second input 46, respectively. This yields an output voltage value $O_2$ based on the comparison of the positive measurement input voltage value P and the third input voltage value, e.g. the threshold voltage value $V_{th}$.

In a third comparison mode, the negative measurement input voltage value N and the third input voltage value, e.g. the threshold voltage $V_{th}$ are inputted at the first input 44 or the second input 46 of the comparison component, respectively, realizing a comparison mode comparing the negative measurement input voltage value N with the third input voltage value, the threshold voltage value $V_{th}$ in this case. This yields an output voltage value $O_3$.

In a fourth comparison mode, the average A is provided at the first input 44 of the comparison component 42 and the third input voltage, e.g. the threshold voltage $V_{th}$, is fed to the second input 46 of the comparison component 42, thus, the average A is compared to the third input voltage value, e.g. the threshold voltage value $V_{th}$ yielding an output voltage value $O_4$.

Thus, by controlling the first switching unit 38 and the second switching unit 40 the different output voltage values $O_1$, $O_2$, $O_3$ and $O_4$ can be determined based on the comparison mode used. These four different output voltage values $O_1$, $O_2$, $O_3$ and $O_4$ can be transmitted to the output 30 of the comparison unit 34, e.g., the output of the logic signal analyzer 18, providing at least a first comparison output voltage value and a second comparison output voltage value of the logic signal analyzer 18.

In the following, different embodiments of different parts of the logic signal analyzer 18 are shown but being essentially the same as the parts of the first embodiment explained in FIGS. 1, 2 and 3a. Accordingly, only the differences are described in the following, wherein identical parts or parts with the same function are identified with the same reference number.

Figure 3B:
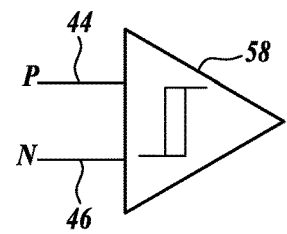

FIG. 3b shows a second embodiment of the comparison component 42. In this embodiment, the comparison component 42 is a comparator 58 without a differential amplifier. Thus, the two inputs of the comparator 58 are the first input 44 and the second input 46 of the comparison component 42. In this case, the fourth input 26 of the logic signal analyzer 18 is not needed and the threshold value $V_{th}$ may be the ground GND.

Figure 4:
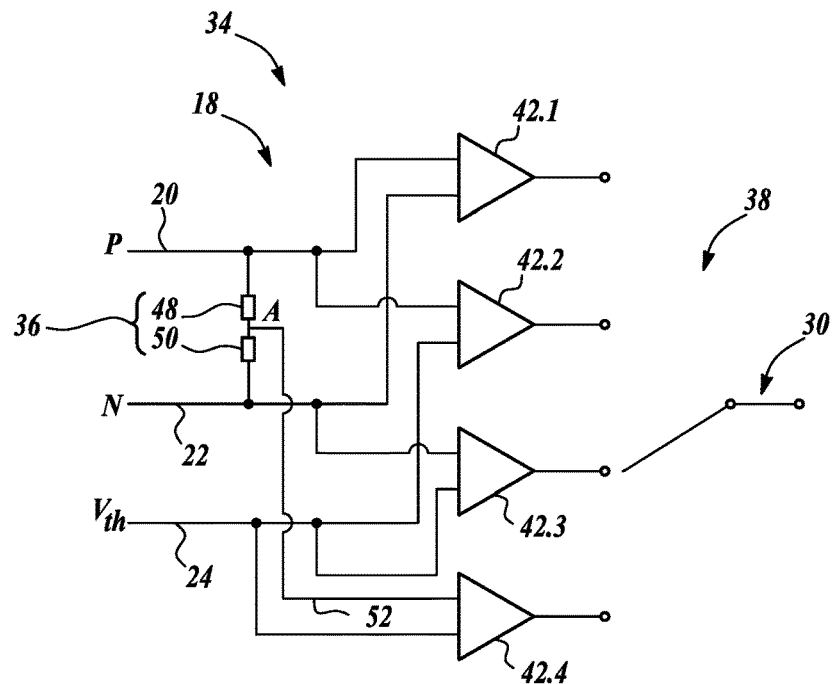
FIG. 4 shows schematically a second embodiment of a logic signal analyzer.

FIG. 4 shows a second embodiment of the logic signal analyzer 18 with a comparison unit 34 comprising four comparison components 42. The comparison component 42 can be designed as shown in FIG. 3a, FIG. 3b or may be a combination thereof.

As shown in FIG. 4, the inputs of the first comparison component 42.1 are connected with the positive measurement input 20 and the negative measurement input 22, respectively, wherein these inputs 20, 22 provide the positive measurement input voltage value P and the negative measurement input voltage value N. The inputs of the second comparison component 42.2 are connected to the positive measurement input 20 and the third input 24 providing the threshold voltage value $V_{th}$, respectively. The inputs of the third comparison component 42.3 are connected to the negative measurement input 22 and the third input 24, respectively. The inputs of the fourth comparison component 42.4 are connected to the average signal line 52 and the third input 24, respectively.

If the comparison components 42 are designed as shown in FIG. 3a, each of the comparison components 42 can be provided with the ground signal GND.

A first and only switching unit 38 is provided between the four comparison components 42 and the output 30. The first switching unit 38 is configured to connect the output of the first comparison component 42.1, the output of the second comparison component 42.2, the output of the third comparison component 42.3 or the output of the fourth comparison component 42.4 with the output of the comparison unit 34, i.e. the output 30 of the logic signal analyzer 18.

Each of the comparison components 42 provides a different output voltage value $O_1$, $O_2$, $O_3$ or $O_4$. Thus, the output voltage value $O_1$, $O_2$, $O_3$ or $O_4$ transmitted to the output 30 is selected using the first switching unit 38. Thus, the first switching unit 38 is configured to change between the different comparison modes of the logic signal analyzer 18.

Figure 5:
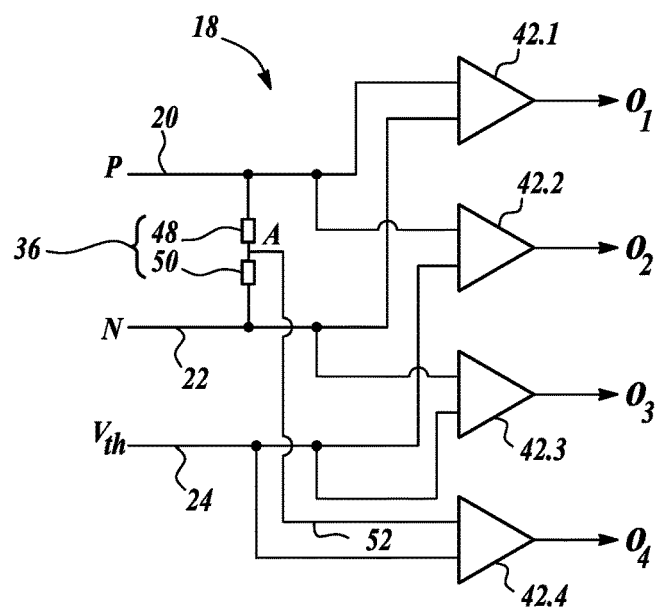
FIG. 5 shows schematically a third embodiment of the logic signal analyzer.

A third embodiment of the logic signal analyzer 18, as shown in FIG. 5, is virtually the same as the second embodiment of FIG. 4, except that no switching unit 38 is provided. Instead, the outputs of all four comparison components 42 are outputted through four outputs of the logic signal analyzer 18, at the same time.

Figure 6:
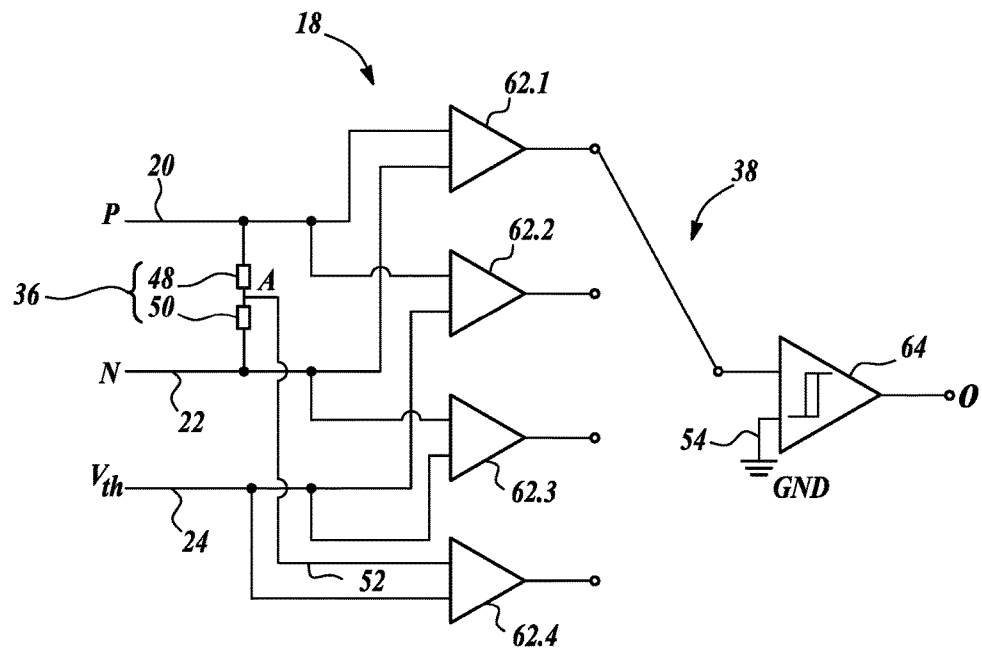
FIG. 6 shows schematically a fourth embodiment of a logic signal analyzer.

A fourth embodiment of the logic signal analyzer 18 shown in FIG. 6 is similar to the second embodiment shown in FIG. 4. But instead of comparison components, four differential amplifiers 62 are used. Thus, the inputs of the first differential amplifier 62.1 are connected to the positive measurement input 20 and the negative measurement input 22, respectively; the inputs of the second differential amplifier 62.2 are connected to the positive measurement input 20 and the third input 24, respectively; the inputs of the third differential amplifier 62.3 are connected to the negative measurement input 22 and the third input 24, respectively; and the inputs of the fourth differential amplifier 62.4 are connected to the average signal line 52 and the third input 24, respectively.

The comparison unit 34 of the logic signal analyzer 18 of the fourth embodiment further comprises one comparator 64 with two inputs, wherein one of the inputs is connected to the fourth input 26, e.g. ground GND. The second input of the comparator 64 can be connected via the first switching unit 38 with the output of one of the differential amplifiers 62. Thus, the first switching unit 38 can change the input of the comparator 64 in order to change the comparison mode. The output of the comparator 64 is connected to the output 30 of the comparison unit 34 and the logic signal analyzer 18.

Figure 7:
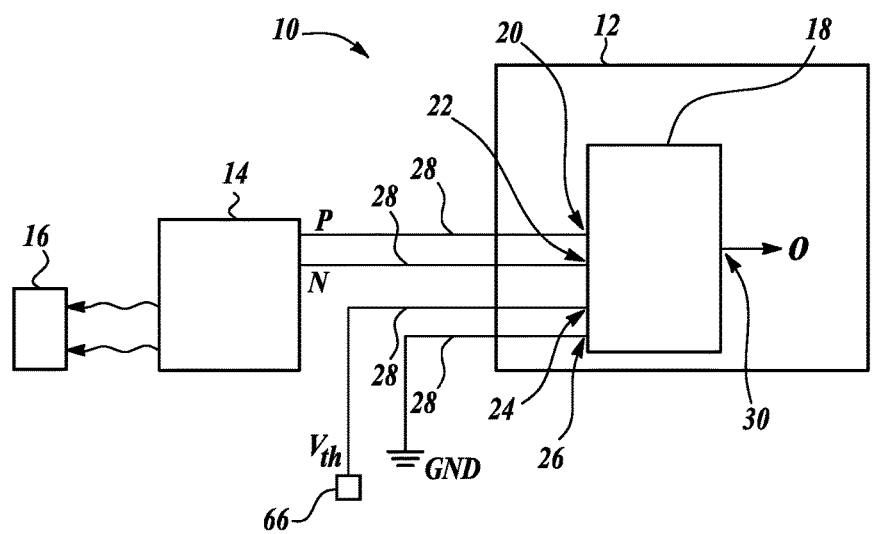
FIG. 7 shows schematically a second embodiment of an oscilloscope.

FIG. 7 shows a second embodiment of an oscilloscope 12. In this embodiment, the third input 24 and the fourth input 26 of the logic signal analyzer 18 are not connected to the logic probe 14, but to other sources. For example, the fourth input 26 can be grounded directly. Furthermore, the ground of the oscilloscope 12 may be used. The third input 24 may also be grounded or connected to a separately formed threshold voltage source 66 to provide a predetermined threshold voltage value at the third input 24. It is also possible, that a zero is provided at the third input 24.

Of course, a combination of the wirings of the first embodiment shown in FIG. 1 and the second embodiment shown in FIG. 7 or any combination or other wirings can be used.

Figure 8:
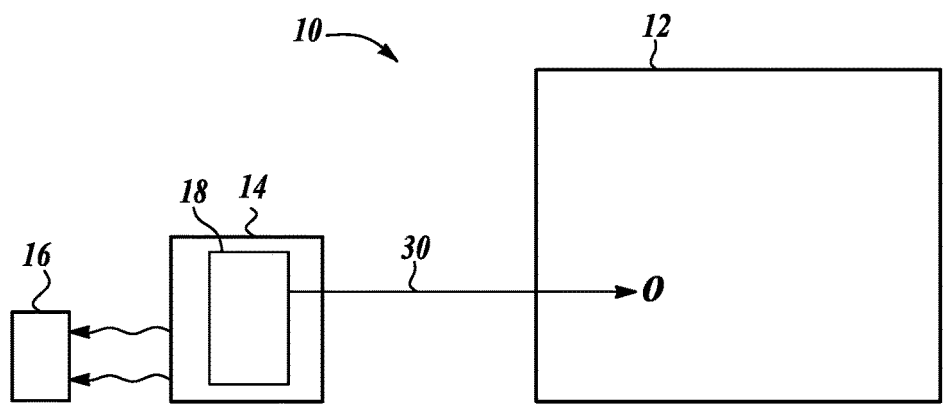
FIG. 8 shows schematically a logic probe with a logic signal analyzer according to an embodiment of the disclosure.

FIG. 8 shows another embodiment of the measurement system 10 with a specific logic probe 14. The logic signal analyzer 18 is provided in the logic probe 14 and the output 30 of the logic signal analyzer 18 is transmitted, for example via a data cable or wireless data connection, to the oscilloscope 12. Hence, a single input of the oscilloscope 12 is occupied while providing the different measurements, in particular the different comparison modes.

Needless to say, either of the shown embodiments of the logic signal analyzer 18 can be used in either of the embodiments of the oscilloscope 12 and the logic probe 14.

Generally, the different input and output voltage values relate to corresponding signals at the measurement inputs.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A logic signal analyzer for analyzing logic signals comprising a positive measurement input providing a positive measurement input voltage value, a negative measurement input providing a negative measurement input voltage value, a third input providing a third input voltage value, and a comparison unit, said comparison unit being configured to provide a first and a second comparison output voltage value each based on one of the following comparison modes:
 a first mode, wherein said positive measurement input voltage value is compared with said negative measurement input voltage value;
 a second mode, wherein said positive measurement input voltage value is compared with said third input voltage value;
 a third mode, wherein said negative measurement input voltage value is compared with said third input voltage value; and
 a fourth mode, wherein an average of said positive measurement input voltage value and said negative measurement input voltage value is compared with said third input voltage value,
 wherein said first and second comparison output values are based on different comparison modes.

2. The logic signal analyzer according to claim 1, wherein said third input voltage value is either zero or at least a predetermined threshold voltage value.

3. The logic signal analyzer according to claim 1, wherein said third input is connected to ground or a threshold voltage source for providing a predetermined threshold voltage as said threshold voltage value.

4. The logic signal analyzer according to claim 1, wherein said logic signal analyzer comprises at least an average signal line connected to said positive measurement input via a first resistor and said negative measurement input via a second resistor.

5. The logic signal analyzer according to claim 4, wherein said logic signal analyzer comprises a voltage divider having said first resistor and said second resistor.

6. The logic signal analyzer according to claim 1, wherein said comparison unit comprises at least one comparison component with a first input and a second input receiving at least two of said input values.

7. The logic signal analyzer according to claim 6, wherein said comparison unit comprises a first switching unit connecting said first input of said comparison component with one of said positive measurement input, said negative measurement input, and said average signal line,
 said comparison unit comprising a second switching unit connecting said second input of the comparison component with said third input or one of said positive measurement input and said negative measurement input.

8. The logic signal analyzer according to claim 7, wherein said first switching unit and said second switching unit are configured to change said comparison mode.

9. The logic signal analyzer according to claim 6, wherein said comparison component is a comparator.

10. The logic signal analyzer according to claim 6, wherein said comparison component comprises a differential amplifier and a comparator, said first input and said second input of said comparison component being connected to inputs of said differential amplifier, and said comparator receiving an output of said differential amplifier and a ground signal as input.

11. The logic signal analyzer according to claim 4, wherein said comparison unit comprises four comparison components each providing an output voltage value,
 said first input and said second input of said first comparison component being connected to said positive measurement input and said negative measurement input, respectively, or vice versa;
 said first input and said second input of said third comparison component being connected to said negative measurement input and said third input, respectively, or vice versa; and
 said first input and said second input of said fourth comparison component being connected to said average signal line and said third input, respectively, or vice versa.

12. The logic signal analyzer according to claim 11, wherein said comparison output voltage value is selected from said output voltage values of said four comparison components by a switching unit.

13. The logic signal analyzer according to claim 11, wherein four comparison output voltage values are provided corresponding to said output voltage values of said four comparison components.

14. The logic signal analyzer according to claim 12, wherein said switching unit is configured to change said comparison mode.

15. The logic signal analyzer according to claim 4, wherein said comparison unit comprises a comparator with two inputs, a switching unit and four differential amplifiers each having two inputs and an output,
 said positive measurement input and said negative measurement input being connected to said inputs of said first differential amplifier;
 said positive measurement input and said third input being connected to said inputs of said second differential amplifier;
 said negative measurement input and said third input being connected to said inputs of said third differential amplifier;
 said average signal line and said third input being connected to said inputs of said fourth differential amplifier;
 said switching unit connecting one of said outputs of said four differential amplifiers to one of said inputs of said comparator, said other input of said comparator being connected to ground.

16. The logic signal analyzer according to claim 15, wherein said switching unit is configured to change said mode of operation.

17. The logic signal analyzer according to claim 1, wherein an amplifier is provided between said comparison unit and at least one of said positive measurement input and said negative measurement input.

18. A logic probe comprising the logic signal analyzer according to claim 1.

19. An oscilloscope comprising the logic signal analyzer according to claim 1.

* * * * *